(12) United States Patent
Nishikawa et al.

(10) Patent No.: US 7,974,817 B2
(45) Date of Patent: Jul. 5, 2011

(54) CAD PROGRAM, STRUCTURE DESIGN SYSTEM, AND STRUCTURE DESIGN METHOD

(75) Inventors: Hiroshi Nishikawa, Toyama (JP); Masahiro Akiyama, Hamamatsu (JP)

(73) Assignees: NIC Autotec, Inc., Toyama-Shi (JP); Armonicos Co., Ltd., Hamamatsu-Shi (JP)

( * ) Notice: Subject to any disclaimer, the term of this patent is extended or adjusted under 35 U.S.C. 154(b) by 442 days.

(21) Appl. No.: 12/326,980

(22) Filed: Dec. 3, 2008

(65) Prior Publication Data

US 2009/0319237 A1 Dec. 24, 2009

(30) Foreign Application Priority Data

Jun. 19, 2008 (JP) ................. 2008-160986

(51) Int. Cl.
*G06F 17/50* (2006.01)
(52) U.S. Cl. ............... 703/1; 700/98; 715/964; 345/419
(58) Field of Classification Search ........ 703/1; 700/95, 700/97, 98; 715/961, 964; 345/418, 419
See application file for complete search history.

(56) References Cited

U.S. PATENT DOCUMENTS

| | | | | |
|---|---|---|---|---|
| 5,003,498 A | * | 3/1991 | Ota et al. | 345/420 |
| 5,602,564 A | * | 2/1997 | Iwamura et al. | 715/782 |
| 5,945,976 A | * | 8/1999 | Iwamura et al. | 345/419 |
| 7,016,747 B1 | * | 3/2006 | Ninomiya | 700/97 |
| 7,454,259 B2 | * | 11/2008 | Ninomiya | 700/98 |
| 2003/0071810 A1 | * | 4/2003 | Shoov et al. | 345/420 |
| 2006/0122723 A1 | * | 6/2006 | Ninomiya | 700/106 |
| 2006/0129258 A1 | * | 6/2006 | Ninomiya | 700/97 |
| 2006/0267980 A1 | * | 11/2006 | Onoue et al. | 345/420 |

FOREIGN PATENT DOCUMENTS

JP 2003-036279 2/2003

OTHER PUBLICATIONS

Hoffmann et al., On User-Defined Features, Computer-Aided Design, vol. 30, Iss. 5, Apr. 1998, pp. 321-332.*

* cited by examiner

*Primary Examiner* — Russell Frejd
(74) *Attorney, Agent, or Firm* — Young & Thompson

(57) ABSTRACT

A computer acquires maximum lengths of a structure as measured along X-axis, Y-axis, and Z-axis directions, and acquires numbers of divisions of line segments which extend along the X-axis, Y-axis, and Z-axis directions, respectively, and have the maximum lengths, respectively. The computer then calculates a basic shape, which is the shape of a rectangular parallelepiped divided into a three-dimensional grid, on the basis of the maximum lengths and the numbers of divisions. The computer creates a basic frame of the structure from the basic shape by deleting a selected line, and adding a line between two selected grid points. The computer calculates structure data, which are three-dimensional data representing the structure, by arranging frame members, which are represented by three-dimensional frame member data, along lines between the grid points of the basic frame. The computer then outputs a drawing of the structure from the structure data.

9 Claims, 14 Drawing Sheets

CAD PROGRAM, STRUCTURE DESIGN SYSTEM, AND STRUCTURE DESIGN METHOD

The entire disclosure of Japanese Patent Application No. 2008-160986 filed Jun. 19, 2008 is expressly incorporated by reference herein.

BACKGROUND OF THE INVENTION

1. Field of the Invention

The present invention relates to a CAD program, a structure design system, and a structure design method, which are useful in particular for efficiently designing a structure composed of a plurality of frame members.

2. Description of the Related Art

Conventionally, in machine working plants, there has been used a base for installing a manufacturing machine or the like, and an apparatus cover for protecting such a machine or the like. In semiconductor plants or like plants, a clean booth has been used so as to install a semiconductor manufacturing apparatus or the like in a clean environment. These structures such as a base are constructed by attaching doors, wall panels, etc. to a basic frame, which serves as the skeleton of the structure. The basic frame is constructed by connecting a plurality of elongated frame members made of, for example, aluminum.

A manufacturer of such a structure designs a structure as a ready-made product for general applications. Further, the manufacturer designs a structure to be used by an ordering party on the basis of specifications of the structure, and delivers members which constitute the structure to the ordering party, along with drawings used for assembling the members. Further, in a case where the number of the members is large, a great burden is imposed on a worker if the steps of assembly are not clearly shown. Therefore, not only a drawing showing the entire configuration of the structure but also drawings (so-called sub-assembly drawings) for main portions of the structure are output and supplied to the ordering party.

In general, a CAD system is used for designing such a structure. For example, design of structures is performed by making use of a three-dimensional CAD system (see, for example, Japanese Patent Application Laid-Open (kokai) No. 2003-36279. In this case, the shapes of various members are defined by three-dimensional data, these members are assembled on the CAD system so as to complete a structure, and drawings of the structure as viewed from six directions or like drawings are output. In the case where design is performed by making use of a three-dimensional CAD system, an operator can readily grasp the shape or the like of a structure by viewing the structure from various angles. In addition, a perspective drawing or a like drawing which is useful for assembly of the structure can be readily output. Meanwhile, design of structures is also performed by making use of a two-dimensional CAD system, and two-dimensional data can be readily produced by placing the structure represented by three-dimensional data, while changing the viewing angle. Design by use of a two-dimensional CAD system is advantageous in that an operator is not required to have a high degree of skill, and design can be completed with a shorter period of time, as compared with the case where a three-dimensional CAD system is used.

However, the conventional designing by use of a three-dimensional CAD system requires an operator to have a high degree of skill, and even an operator having a high degree of skill takes a longer time for design, as compared the case where the operator uses a two-dimensional CAD system. In the case of designing by use of a two-dimensional CAD system, design errors easily occur, because grasping of the shapes of members or the like is difficult, as compared with the case where a three-dimensional CAD system is employed.

Further, since an actual structure is constructed in accordance with drawings output from a three-dimensional CAD system, the operator must design the structure by use of the three-dimensional CAD system, while checking whether or not the structure can be assembled in actuality. Further, in order to output sub-assembly drawings, the operator must consider the assembly sequence of the structure. That is, the operator is required to have a certain degree of experience and engineering knowledge regarding assembly of the structure, and merely knowing the operation of the three-dimensional CAD system well is insufficient.

As described above, designing a structure by use of a three-dimensional CAD system has a problem in that an operator is required to have a high degree of skill, and a long time is needed to complete the design.

SUMMARY OF THE INVENTION

In view of the foregoing, an object of the present invention is to provide a CAD program, a structure design system, and a structure design method, which enable an unskilled person to design a structure within a short period of time.

A first mode of the present invention for achieving the above-described object is a CAD program for designing a structure composed of a plurality of frame members, the CAD program causing a computer having input means and display means to realize an input function for acquiring, via the input means, maximum lengths of the structure as measured along X-axis, Y-axis, and Z-axis directions, and acquiring numbers of divisions of line segments which extend along the X-axis, Y-axis, and Z-axis directions, respectively, and have the maximum lengths, respectively; an basic shape calculation function for calculating three dimensional data representing a basic shape which is the shape of a rectangular parallelepiped divided into a three-dimensional grid, and in which lengths of sides extending along the three directions are equal to the corresponding maximum lengths of the structure, and numbers of grid surfaces of the basic shape arranged in the three directions are equal to the corresponding numbers of divisions in the three directions; a basic frame creation function for creating a basic frame of the structure from the basic shape by allowing an operator to select, via the input mean, a line connecting grid points of the basic shape displayed on the display means in the form of a wire frame, to delete the line selected by the input means, and add a line between two grid points selected by the input means; a structure data calculation function for calculating structure data, which are three-dimensional data representing the structure, by arranging frame members, which are represented by three-dimensional frame member data, along lines between the grid points of the basic frame; and a drawing outputting function for outputting a drawing of the structure from the structure data.

In the first mode, a user (operator) can obtain a basic shape by merely inputting parameters, and can obtain a basic frame, which serves as the skeleton of a structure, basically by merely removing unnecessary lines from the basic shape. The user then selects frame members to be applied to the basic frame, whereby the structure, which is composed of the frame members, can be obtained. Since the frame members are not required to be assembled on a CAD system, the structure can be designed within a short period of time.

A second mode of the present invention is a CAD program according to the first mode, characterized by further causing the computer to realize a frame member editing function for allowing the operator to select, via the input means, a frame member of the structure displayed on the display means on the basis of the structure data, and replacing that frame member selected by the input means with a frame member of a different type.

The second mode enables use of frame members suitable for the structure.

A third mode of the present invention is a CAD program according to the first or second mode, characterized by further causing the computer to realize a plate-like member adding function for allowing the operator to select, via the input means, a plurality of frame members of the structure displayed on the display means on the basis of the structure data, calculating three-dimensional data representing a plate-like member which fits a region surrounded by the frame members selected by the input means, and calculating a position of the plate-like member in relation to the structure.

The third mode enables easy addition of a plate-like member to the structure.

A fourth mode of the present invention is a CAD program according to any one of the first to third modes, characterized by further causing the computer to realize a fixing member adding function for disposing three-dimensional data representing a fixing member for fixing frame members together, at a location where the frame members are connected together.

The fourth mode enables easy addition of a fixing member to the structure.

A fifth mode of the present invention is a CAD program according to the fourth mode, characterized in that the fixing member adding function adds to the structure data a placing position of the fixing member which must be attached to one of the frame members before the frame members are connected together; and the drawing outputting function outputs a drawing on which the placing position of the fixing member is depicted.

In the fifth mode, for two frame members which are restricted in terms of the order of assembly, a drawing in which the placing position of the fixing member is depicted on one frame member is output. Such a drawing can call a worker's attention to the fact that the fixing member must be first attached to that frame member. As a result, it is possible to prevent the worker from mistakenly connecting the frame members together without placing the fixing member on the frame members.

A sixth mode of the present invention is a CAD program according to any one of the first to fifth modes, characterized by further causing the computer to realize a partial structure defining function for allowing the operator to select, via the input means, a plurality of frame members of the structure displayed on the display means on the basis of the structure data, and defining the frame members selected by the input means as a partial structure.

The sixth mode enables easy output of a so-called sub-assembly drawing.

A seventh mode of the present invention is a CAD program according to any one of the first to sixth modes, characterized by further causing the computer to realize a member number assignment function for assigning the same number to members of the same type among the frame members of the structure; and the drawing output function outputs a drawing of the structure along with the number.

In the seventh mode, since locations on the structure where the frame members of a plurality of types are used are clear at a glance, the assembly work becomes easier.

An eighth mode of the present invention is a structure design system comprising a server apparatus which can execute a CAD program according to any one of the first through seventh modes, and a client apparatus which can exchange data with the server apparatus via communication means, wherein the client apparatus sends the maximum lengths of the structure, the numbers of divisions, and specifications of the structure to the server apparatus; and the server apparatus executes the CAD program on the basis of the maximum lengths of the structure, the numbers of divisions, and the specifications of the structure, received from the client apparatus, to thereby calculate the structure data, and sends to the client apparatus a drawing of the structure on the basis of the structure data.

The eighth mode enables quick performance of a business in which an ordering party which requests design of a structure provides the specifications of a structure, among others, and an order receiving party designs the structure by use of the CAD program of the present invention and delivers drawings, etc. to the ordering party.

A ninth, mode of the present invention is a method of designing a structure composed of a plurality of frame members by use of a computer including a processor, input means, and display means, the method comprising an input step in which the processor acquires, via the input means, maximum lengths of the structure as measured along X-axis, Y-axis, and Z-axis directions, and acquires numbers of divisions of line segments which extend along the X-axis, Y-axis, and Z-axis directions, respectively, and have the maximum lengths, respectively; a basic shape calculation step in which the processor calculates three dimensional data representing a basic shape which is the shape of a rectangular parallelepiped divided into a three-dimensional grid structure, and in which lengths of sides extending along the three directions are equal to the corresponding maximum lengths of the structure, and numbers of grid surfaces of the basic shape arranged in the three directions are equal to the corresponding numbers of divisions in the three directions; a basic frame creation step in which the processor creates a basic frame of the structure from the basic shape by allowing an operator to select, via the input means, a line connecting grid points of the basic shape displayed on the display means in the form of a wire frame, to delete the line selected by the input means, and add a line between two grid points selected by the input means; a structure data calculation step in which the processor calculates structure data, which are three-dimensional data representing the structure, by arranging frame members, which are represented by three-dimensional frame member data, along lines between the grid points of the basic frame; and a drawing outputting step in which the processor outputs a drawing of the structure from the structure data.

In the ninth mode, a basic shape can be obtained through inputting of parameters, and a basic frame, which serves as the skeleton of a structure, can be obtained through removal of selected lines from the basic shape. The structure, which is composed of the frame members, can be obtained through placement of frame members along the basic frame. Since the frame members are not required to be assembled on a CAD system, the structure can be designed within a short period of time.

According to the present invention, a CAD program and a structure design system which enable an unskilled person to design a structure within a short period of time are provided.

DESCRIPTION OF THE PREFERRED EMBODIMENTS

Embodiments of the present invention will now be described. Notably, the embodiments will be described as illustrative examples, and the present invention is not limited thereto.

First Embodiment

Before describing a CAD program according to the present embodiment, a structure to be designed by the CAD program will be described.

Figure 1:
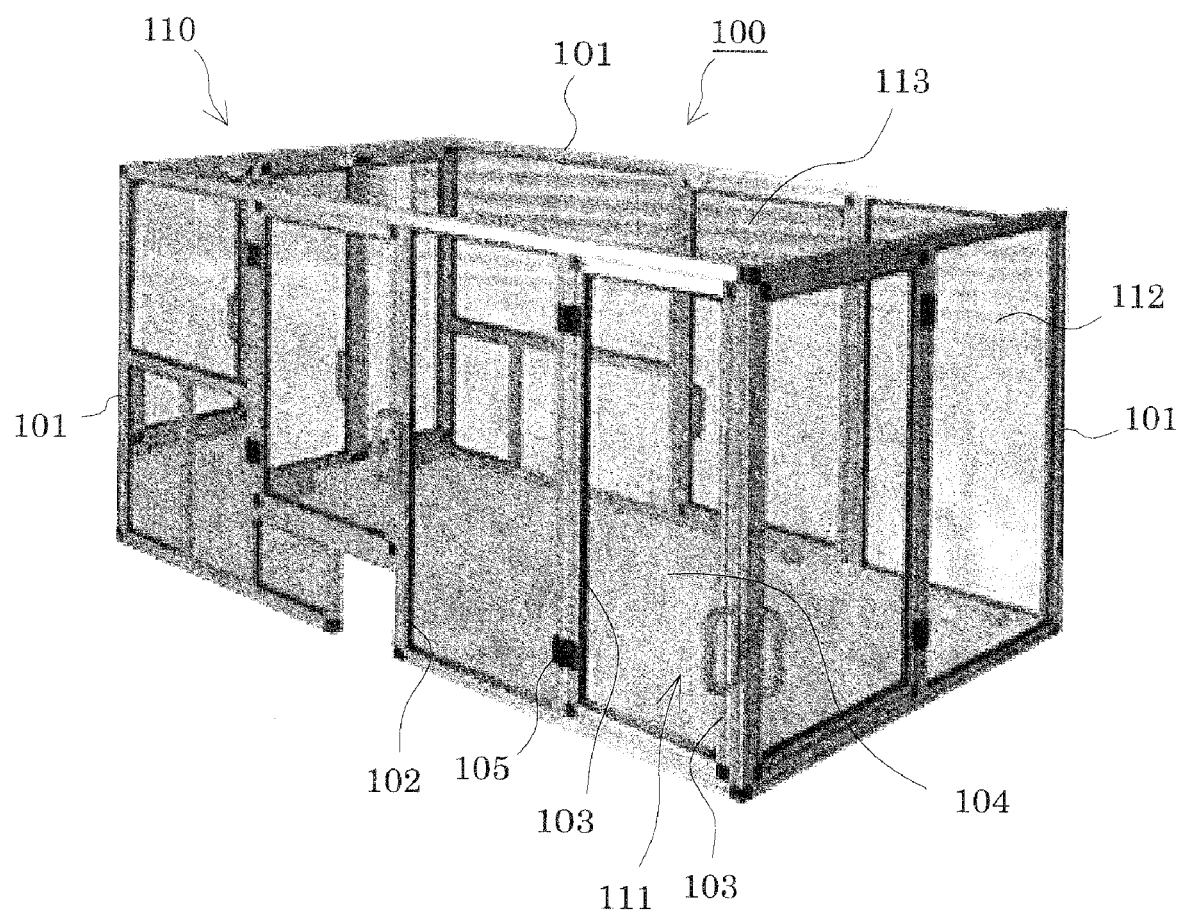
FIG. 1 is a schematic perspective view of an apparatus cover.

FIG. 1 is a schematic perspective view of an apparatus cover, which is an example structure. As illustrated, an apparatus cover 100 includes a basic frame 110, which serves as a skeleton thereof; and doors 111, wall panels 112, and a top panel 113, which are attached to the basic frame 110. The basic frame 110 is composed of a plurality of frame members 101, each of which is an elongated member made of aluminum. The frame members 101 are assembled such that the members form a rectangular parallelepiped as a whole. Fixing members 102, including a bracket, a nut, a bolt, etc., are attached to a location at which adjacent frame members 101 form an L-like shape or T-like shape and are fixed together by the fixing members 102.

The top panel 113 (shown as being translucent in FIG. 1) is attached to a top portion of the apparatus cover 100. Side portions of the apparatus cover 100 are divided into several regions by the frame members 101. The doors 111 and the wall panels 112 (both of which are shown as being translucent in FIG. 1) are installed in corresponding regions. Each of the doors 111 includes a door frame formed by assembling four frame members 103 into a rectangular shape, and a plate-like member 104 (shown as being translucent in FIG. 1) attached to the door frame. The doors 111 are attached to the basic frame 110 via hinges 105.

Such an apparatus cover 100 accommodates therein an apparatus or the like to be protected, enabling protection of the apparatus or the like from the outside environment.

Hereinafter, there will be described a CAD program for designing a structure, such as the above-described apparatus cover 100, which is formed from various frame members.

Figure 2:
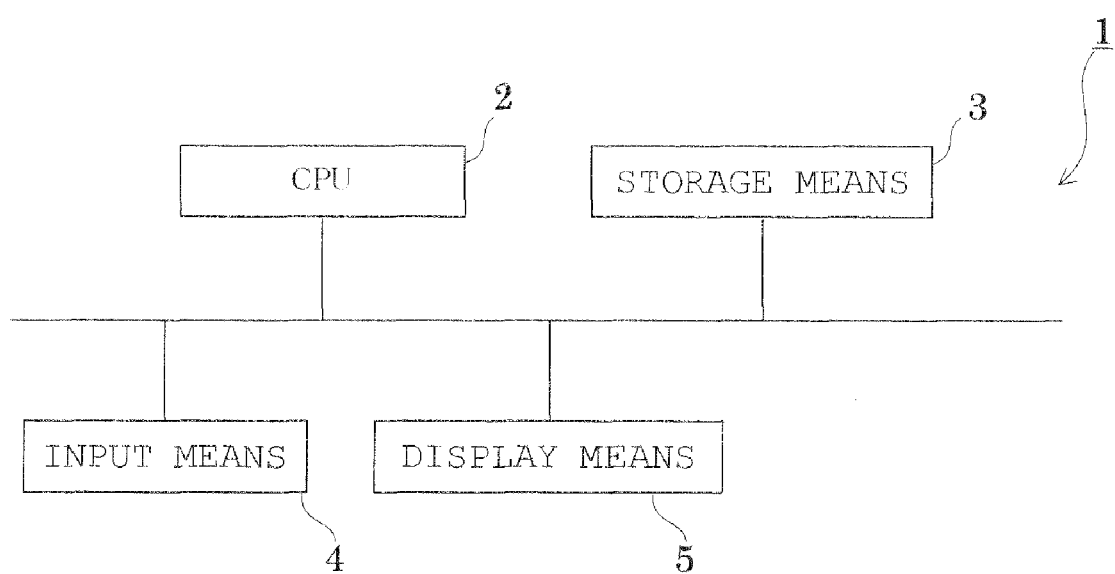
FIG. 2 is a functional block diagram of a computer which executes a CAD program according to a first embodiment of the present invention.

FIG. 2 is a functional block diagram of a computer which executes a CAD program according to the first embodiment of the present invention. As illustrated, a computer 1, which is a common information processing device, includes a CPU 2 (processor), storage means 3 (RAM, a hard disk drive, etc.), input means 4 (a keyboard, a mouse, etc.), and display means 5 (a display, etc.).

The CAD program is stored, for example, in the hard disk drive. The CPU 2 reads the CAD program out of the hard disk drive, writes it in the RAM, and then, executes it. The CAD program is configured such that various data therefor are input via the input means 4, and CAD data or the like are displayed on the display means 5.

Figure 3:
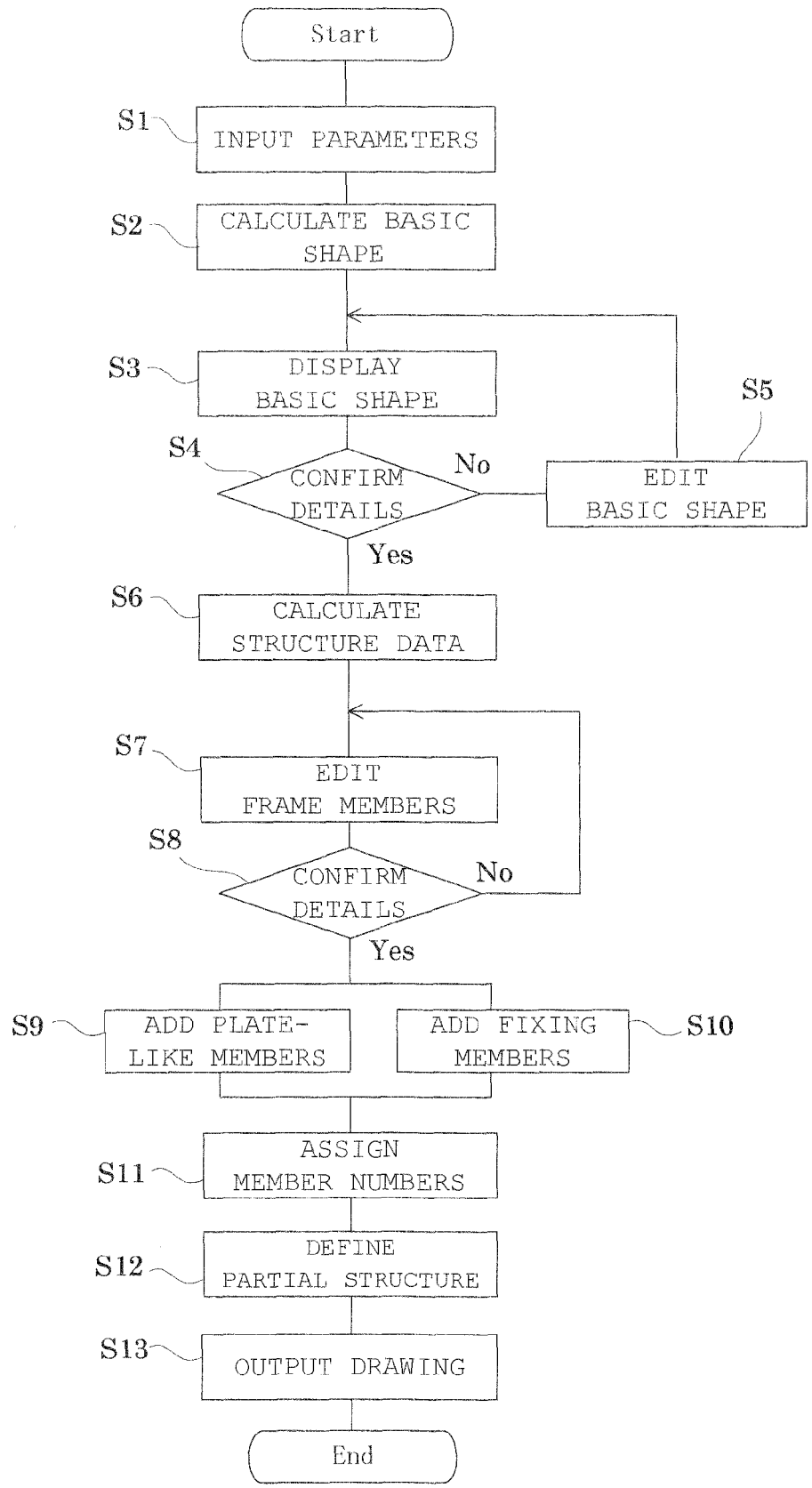
FIG. 3 is a flowchart showing the operation of the CAD program according to the first embodiment.

The CAD program of the present invention causes the computer 1 to realize an inputting function, a basic shape calculation function, a basic frame creation function, a structure data calculation function, a drawing outputting function, a frame member editing function, a plate-like member adding function, a fixing member adding function, a partial structure defining function, and a member number assignment function. These functions will now be specifically described with reference to FIG. 3. FIG. 3 is a flowchart showing the operation of the CAD program according to the present embodiment. The processing shown in FIG. 3 is executed by the CPU 2 of the computer 1.

As shown in FIG. 3, in step 1, parameters necessary for calculating a basic shape (the details of which will, be described later) are input (inputting function). That is, the CPU 2 acquires, via the input means 4, the maximum lengths of the to-be-designed structure as measured along the directions of an X-axis, a Y-axis, and a Z-axis, and stores them in the storage means 3. In addition, the CPU 2 acquires, via the input means 4, the numbers of divisions of line segments extending along the three directions, respectively, and having the corresponding maximum lengths, and stores them in the storage means 3.

Figure 4:
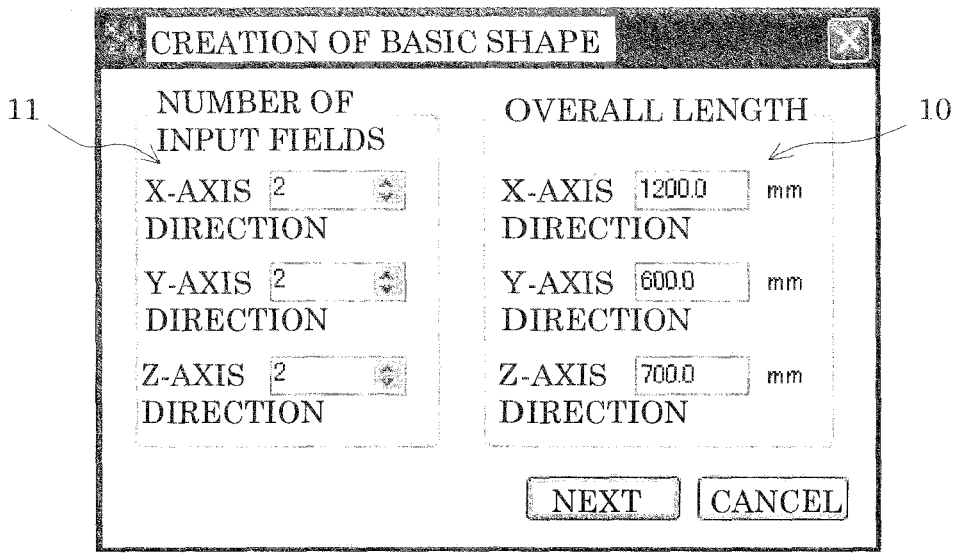
FIG. 4 is an example input screen used for inputting parameters.
Figure 5:
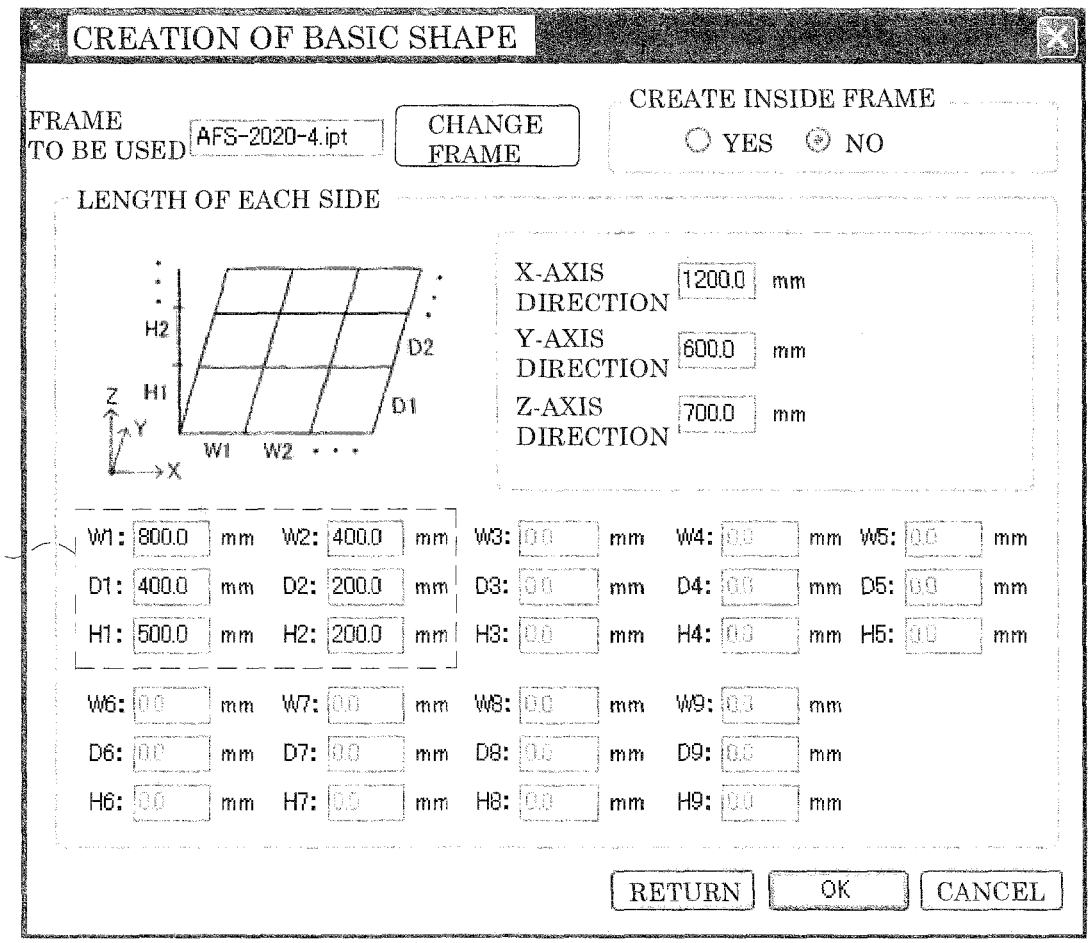
FIG. 5 is an example input screen used for inputting parameters.

FIGS. 4 and 5 show an example input screen used for inputting the parameters. As shown in FIG. 4, three forms 10 are displayed on the display means 5. Each of the forms 10 is used for inputting the maximum length (indicated as "overall length" in FIG. 4) of the structure in the unit of mm for the corresponding axis. In addition, three forms 11 are displayed on the display means 5. Each of the forms 11 is used for inputting the number of divisions of the line segment having the maximum length (indicated as "the number of input fields" in FIG. 4) for the corresponding axis The maximum length (overall length) in each axis is used for defining the maximum length of the structure, formed by a plurality of frame members, as measured along the direction of each axis. Meanwhile, the number of divisions is used for specifying the maximum number of the frame members to be connected along the direction of each axis. For example, assume that the maximum length in the X axis direction is 1200 mm, and the number of divisions in the X axis direction is 2. In this case, the maximum number of the frame members to be connected along the X axis direction of the structure is 2, and the overall length of the frame members is 1200 mm.

As shown in FIG. 5, forms 12 used for individually inputting the lengths of respective sub-segments of each divided line segment are displayed on the display means 5. For example, assume that the number of divisions in each of the X-axis, Y-axis, and Z-axis directions is 2, and the lengths of respective segments of the divided sides are W1. W2, D1, D2, H1, and H2, respectively. In this case, six forms 12 are displayed on the display means 5 so as to input the lengths W1, W2, D1, D2, H1, and H2 via the form 12. Notably, inputting of the lengths of the respective segments is not essential. Instead, for example, a length determined by dividing the maximum length by the number of divisions may be set as a default value.

Next, in step 2 (see FIG. 3), a basic shape is calculated on the basis of the parameters input in step 1 (basic shape calculation function). The basic shape herein refers to the shape of a rectangular parallelepiped which is divided to have a three-dimensional grid structure and is represented by three-dimensional data, and in which the lengths of the sides extending along the directions of the three axes are equal to the maximum lengths input in step 1 for the three axes, and the numbers of grid surfaces arranged along the directions of the three axes are equal to the numbers of divisions input in step 1 for the three axes. For example, the CPU 2 calculates three-dimensional coordinates of each grid point of the basic shape on the basis of the parameters input in step 1, and stores them in the storage means 3.

Next, in steps 3 to 5 (see FIG. 3), the CPU 2 displays the basic shape calculated in step 2, and causes a user to edit the basic frame of the structure via the input means to thereby complete the basic frame (basic frame creation function).

Figure 6:
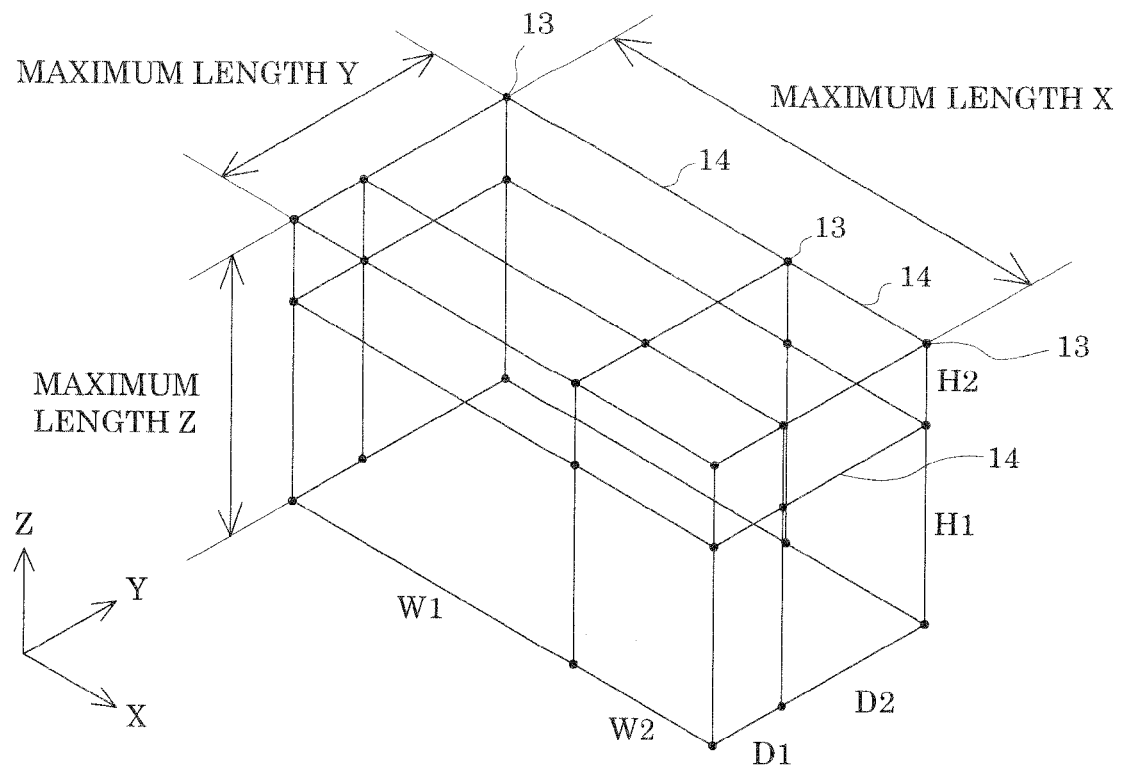
FIG. 6 is a schematic diagram of a basic shape displayed on display means in the form of a wire frame.

Specifically, first, in step 3, the CPU 2 displays the basic shape on the display means 5 in the form of a wire frame. FIG. 6 is a schematic diagram of the basic shape displayed on the display means in the form of a wire frame. For the purpose of facilitating the understanding, each grid point 13 is indicated by a black dot.

As illustrated, a rectangular parallelepiped having sides having the maximum length X (X-axis), the maximum length Y (Y-axis), and the maximum length Z (Z-axis) input in step 1 is displayed on a predetermined scale such that the rectangular parallelepiped is divided into a three-dimensional grid. A rectangular region surrounded by four grid points 13 on the X-Z plane will be referred to as a "grid surface." Two grid surfaces are arranged in the X axis direction. The number of the grid surfaces arranged in the X axis direction is equal to the number of divisions input in step 1 for the X-axis. This applies to the case of the X-Y plane and the Y-Z plane. In the present embodiment, among the lines connecting the grid points 13, lines passing through the inside of the rectangular parallelepiped are not depicted.

Next, in step 4, the CPU 2 prompts the user of the CAD program to confirm the details of the basic shape which is displayed. If the details of the basic shape need to be further edited (No in step S4), the CPU 2 executes editing of the basic shape (step S5).

In step 5, the CPU 2 enables the user to select a line 14 connecting grid points 13 via the input means, and delete the line 14 selected via the input means, or add a line 14 between two grid points 13 selected via the input means. Every time such deletion or addition is made, the CPU 2 displays the basic shape again (step S3), and prompts the user to confirm the details of the basic shape (step S4). The basic frame, which is the skeleton of the structure to be designed, is created from the original basic shape by repeating steps S3 to S5 an appropriate number of times.

Figure 7:
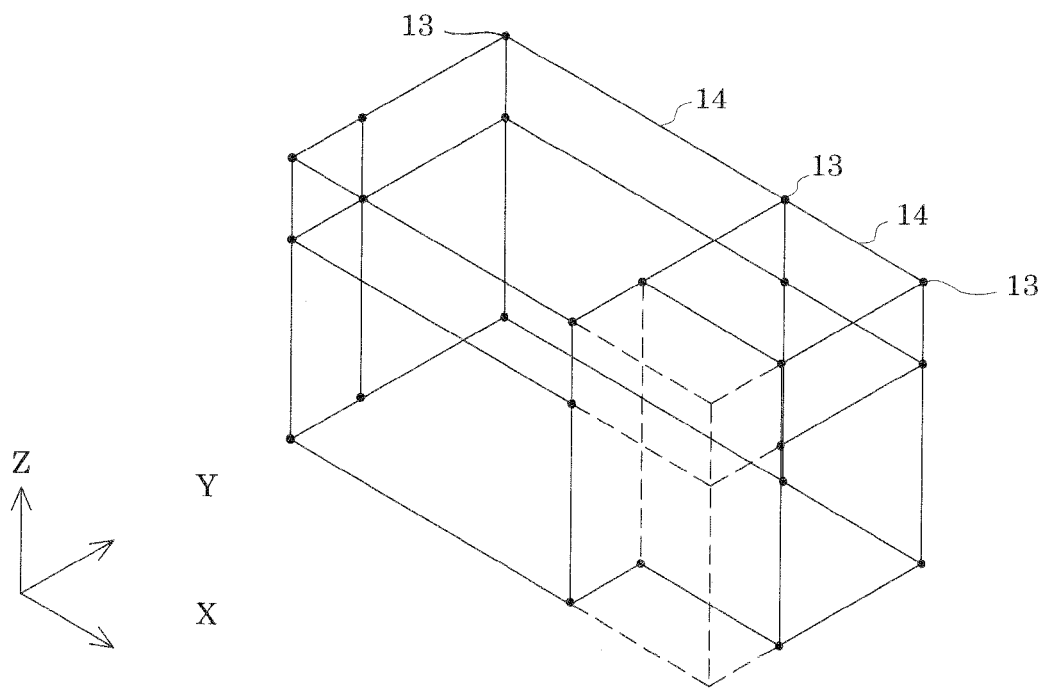
FIG. 7 is a schematic diagram showing an example basic frame created from the basic shape.

FIG. 7 is a schematic diagram showing an example basic frame created from the basic shape. In FIG. 7, the lines 14 deleted in step S5 are shown by broken lines. As illustrated, there has been created the basic frame of a structure having the form of a rectangular parallelepiped with a portion thereof removed.

Next, in step 6, frame members, which are represented by three-dimensional frame member data, are arranged along the lines 14 between the grid points 13 of the basic frame, whereby structure data, which are three-dimensional data representing the structure, are calculated (structure data calculation function). The frame member data have been stored in a database, file, or the like in advance, as three-dimensional data representing the shapes and sizes of various frame members. The frame member data are associated with model numbers for management purpose.

Next, the CPU 2 sets the coordinates of the frame members such that frame members represented by the frame member data are located along the lines connecting the grid points 13 of the basic frame. Through setting of the shapes, sizes, and positions of the frame members as described above, the structure data are obtained.

Figures 8A, 8B:
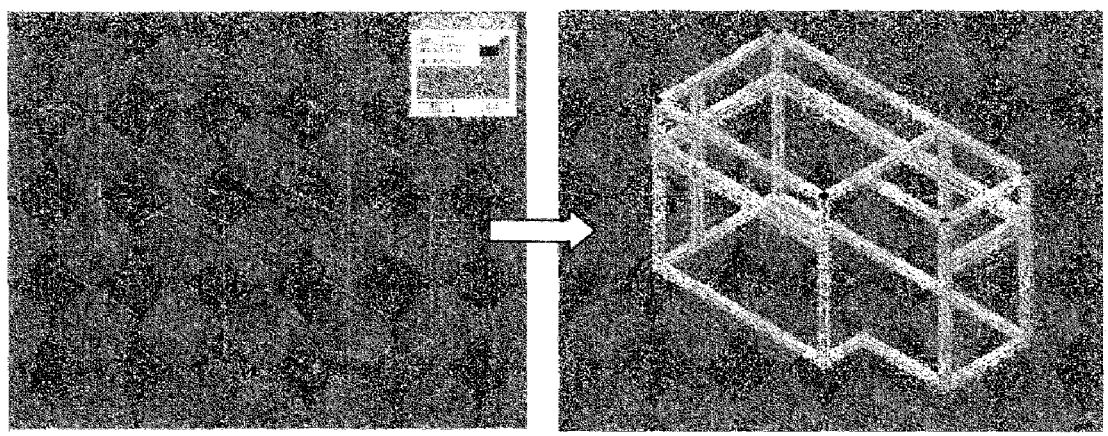
FIG. 8 is a schematic diagram showing a state in which structure data calculated on the basis of the basic frame is displayed on the display means.

FIG. 8 is a schematic diagram shows a state in which the structure data calculated from the basic frame is displayed on the display means. As illustrated, the frame members based on the frame member data are displayed such that they extend along the lines 14 (see section (a) of FIG. 8) connecting the grid points 13 of the basic frame (see section (b) of FIG. 8).

In step S6, a certain frame member among a plurality of frame members of different types is used as a default. Needless to say, the frame member may be changed to that of another type.

In step S7, the CPU 2 performs processing for editing the frame members (frame member editing function). For example, the CPU 2 causes the user of the CAD program to select a frame member of the structure displayed on the display means 5 via the input means 4. Meanwhile, the CPU 2 displays a screen for showing a list of frame members of other types, and prompts the user of the CAD program to select any other frame member from the list. Next, the CPU 2 replaces the frame member selected by the user via the input means 4 with the frame member selected from the list so as to update the structure data. With this operation, the structure can be designed by using frame members which the designer wants to use.

After the user edits the frame members (step S7), the user confirms the details of the structure (step S8). If the user determines that further editing is needed (No in step S8), the user edits the frame members again (step S7). If the user judges that editing is no longer needed (Yes in step S8), the user executes the next step.

In the next step, either one of steps S9 to S10 is selectively executed. That is, there is no rule on the sequence of these steps, and each step is executed upon selection thereof by the user.

In step S9, processing for adding plate-like members to the structure is executed (plate-like member adding function). The plate-like members herein refer to wall panels, top panels, doors, and the like.

Figure 9A:
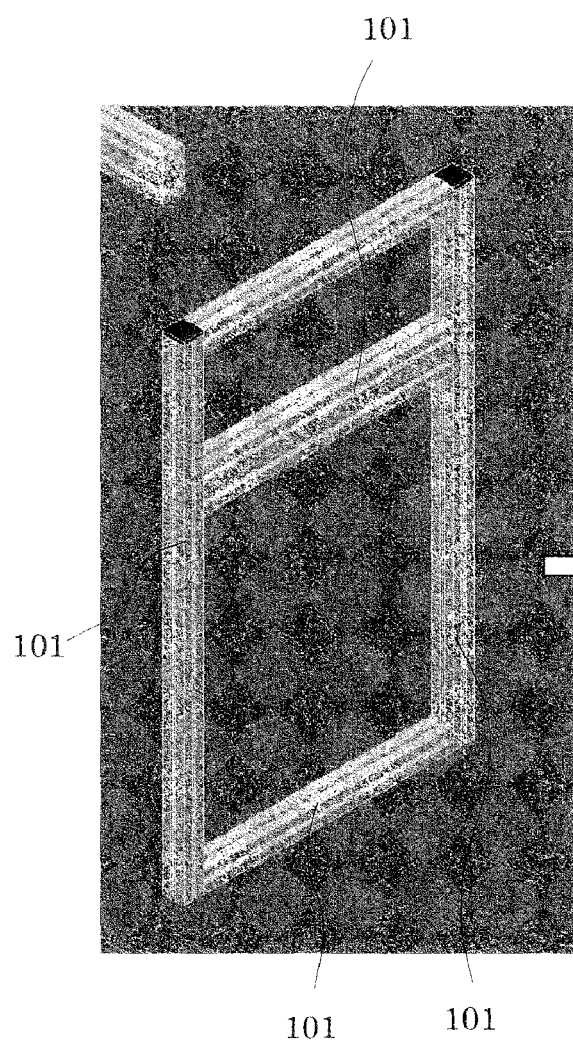
FIG. 9 is an enlarged view of a main portion of the structure for showing processing of adding a plate-like member.
Figure 9B:
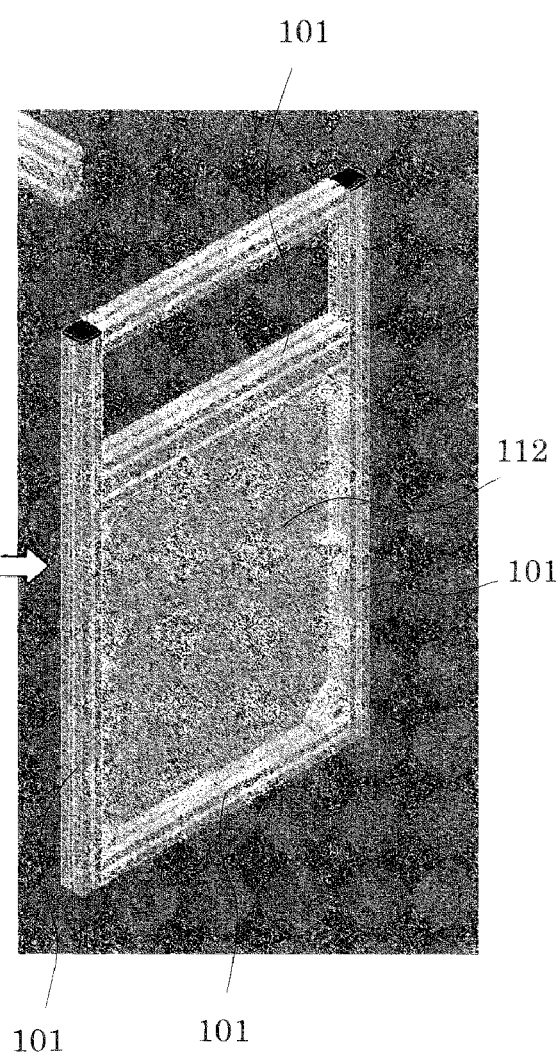

FIG. 9 is an enlarged view of a main portion of the structure for showing the processing for adding the plate-like members. Specifically, as shown in section (a) of FIG. 9, first, the CPU 2 enables the user to select, via the input means, frame members 101 of the structure displayed on the display means 5 on the basis of the structure data. Subsequently, the CPU 2 calculates three-dimensional data representing a plate-like member which fits a region surrounded by the frame members 101 selected by the user via the input means 4, and calculates the position of the plate-like member in relation to the structure.

The three-dimensional data representing the plate-like member which fits the region are obtained by calculating the size of the region on the basis of a positional relationship among the selected frame members 101, and calculating the size and shape of the plate-like member such that the size and shape of the plate-like member coincide with those of the region. In addition, the position of the plate-like member in relation to the structure can be determined on the basis of the coordinates of the region surrounded by the selected frame members 101. The size, shape, and position of the plate-like member determined by these calculations are stored together in the storage means 3 as a portion of the structure data.

Section (b) of FIG. 9 shows the plate-like member, whose data are added to the structure data, displayed on the display means 5. As illustrated, a wall panel 112 (shown as being translucent in section (b) of FIG. 9), which is an example plate-like member, is placed in the region surrounded by the selected frame members 101. As described above, by merely selecting a plurality of frame members 101, a plate-like member which fits a region surrounded by these frame members 101 can be placed.

Figure 10:
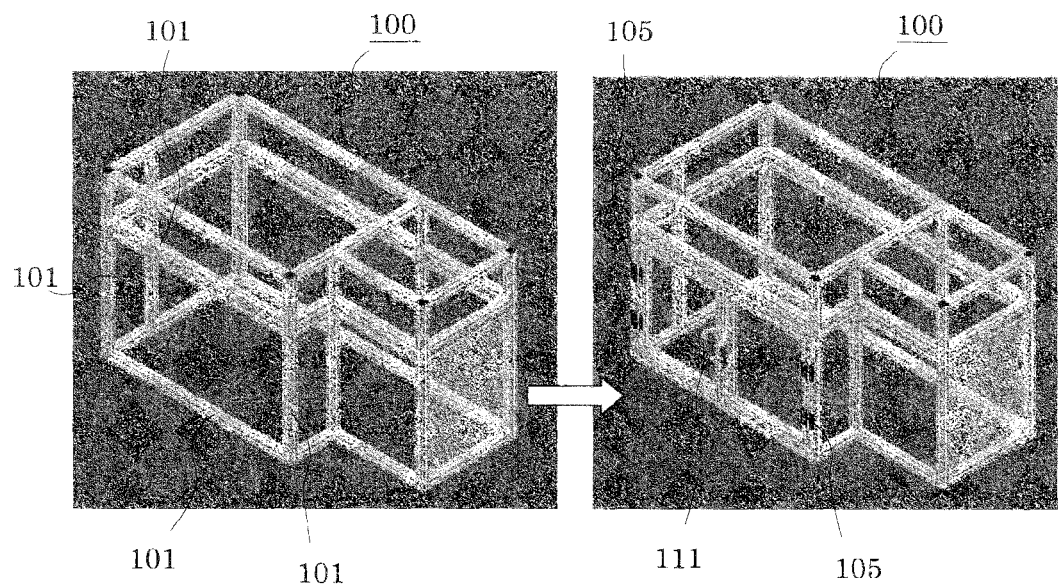
FIG. 10 is a schematic diagram showing the structure in which a door is placed as an example plate-like member.

FIG. 10 shows a structure in which a door is placed as an example plate-like member. Although detailed description of processing for placing the door is omitted because it is the same as the case of the wall panel 112, a door 111 which fits a region surrounded by the selected frame members is placed, and at the same time, hinges 105 for connecting the door 111 to the corresponding frame member 101 are automatically placed.

In step S10, processing for adding fixing members to the structure is executed (fixing member adding function). The fixing members herein include brackets, bolts, nuts, etc. for connecting adjacent frame members together. The CPU 2 identifies a location at which the adjacent frame members are connected, on the basis of the positions, sizes, and shapes of the adjacent frame members, and calculates the positions of the fixing members in relation to the structure such that the fixing members whose sizes and shapes are represented by three-dimensional data are placed at that location. The sizes, shapes, and positions of the fixing members determined by these calculations are stored together in the storage means 3 as a portion of the structure data.

Figure 11:
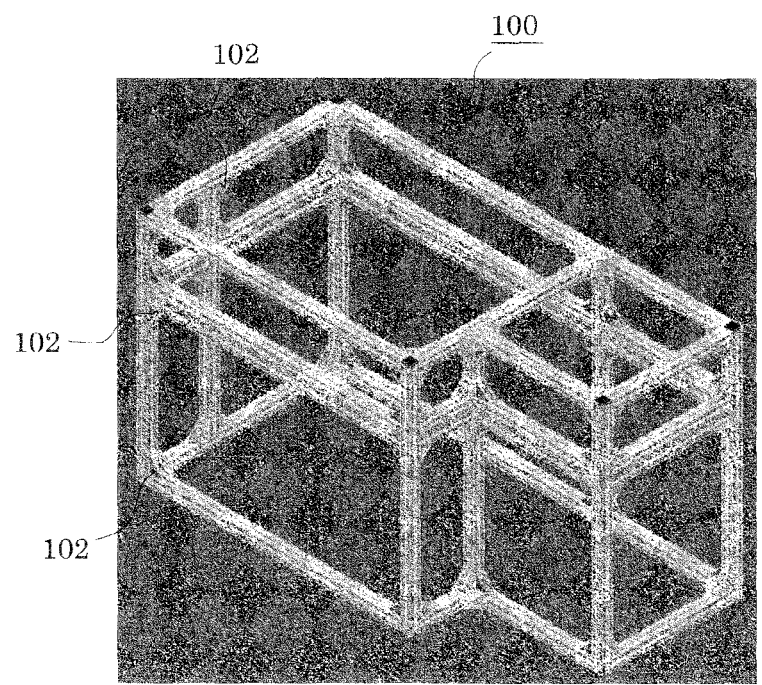
FIG. 11 is a schematic diagram showing a state in which the structure data to which fixing members have been added is displayed on the display means.

FIG. 11 shows a structure displayed on the display means 5 on the basis of the structure data to which data of the fixing members are added. As illustrated, for example, a bracket 102, which is one fixing member, is placed at a location at which adjacent frame members 101 are connected together to form an L-like shape or T-like shape. In addition, although not specifically illustrated, a nut, which is another fixing member, is automatically placed on the side surface of each of the frame members 101 to which the bracket 102 is attached. A bolt, which is another fixing member, is attached to the nut, whereby the adjacent frame members 101 are fixed together by the bolt and the nut. As described above, the fixing members for fixing the frame members 101 are automatically placed.

Figure 12:
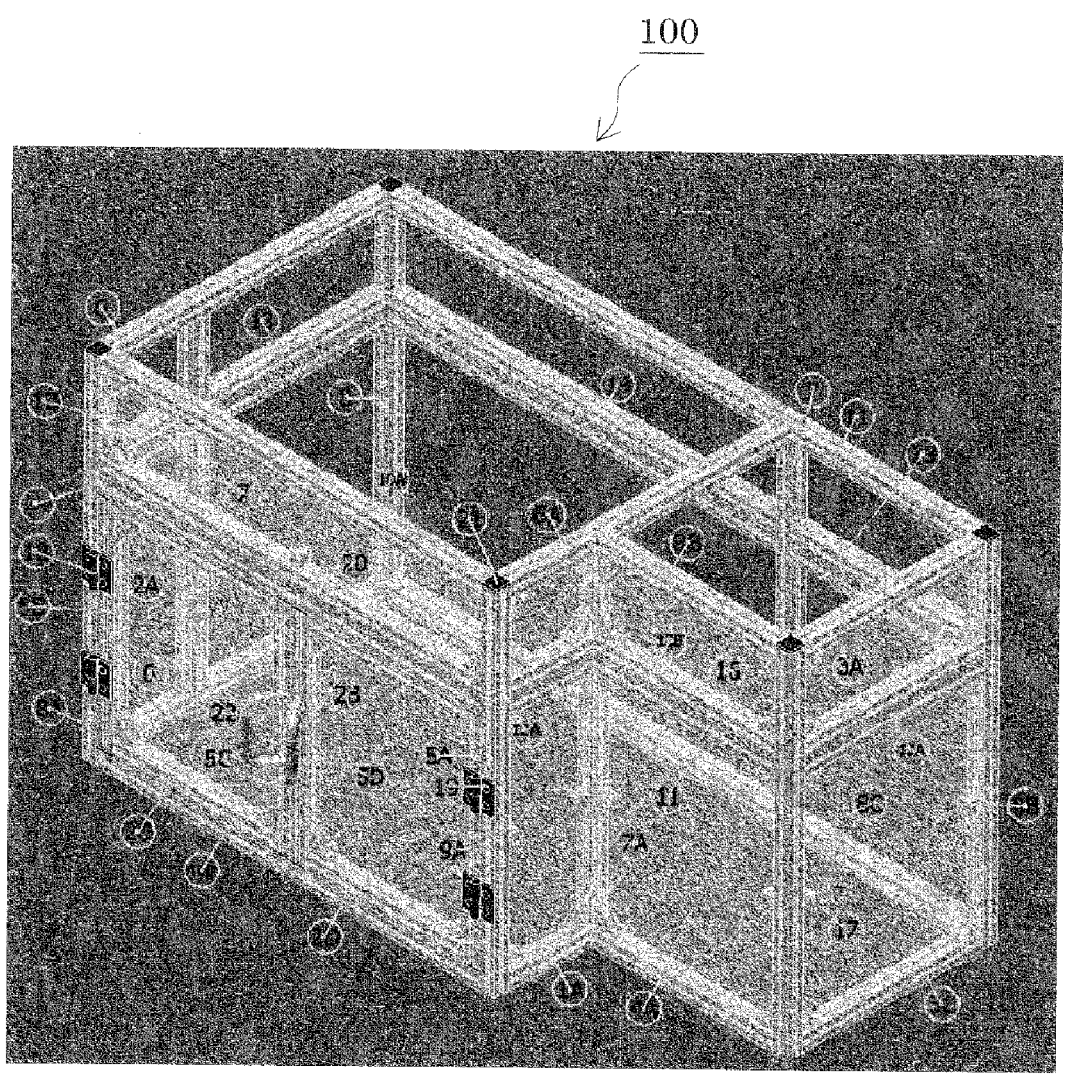
FIG. 12 is a schematic diagram of the structure displayed with member numbers added thereto.

Next, in step S11, processing for assigning member numbers to individual members of the structure (member number assignment function) is executed. Specifically, the CPU 2 assigns member numbers to the frame members used in steps S6 to S8, the plate-like members added in step S9, and the fixing members added in step S10, such that the same member number is displayed for members of the same model number on the display means 5. FIG. 12 shows a state in which the structure is displayed with the member numbers added thereto. As illustrated, a circled numeral is added to each member. With this operation, a mistake of assigning different numbers to members of the same model number can be prevented. In addition, this function enables output of a drawing in which the member numbers are added, the details of which will be described later.

Next, in step S12, processing for defining a partial structure from the structure (partial structure defining function) is executed. Specifically, first, the CPU 2 enables the user to select, via the input means, frame members 101 from the structure displayed on the display means 5 on the basis of the structure data. Subsequently, the CPU 2 defines the frame members 101 selected by the user via the input means 4 as a partial structure. The defining processing is executed, for example, by providing the frame member data related to the selected frame members with an ID indicating that the selected frame members constitute a partial structure related to the front portion of the structure. With this operation, when a drawing is created, the frame members 101 related to the front portion can be taken out and output in the form of a drawing. The details of this operation will be described later.

In step S13, various drawings are output on the basis of the structure data representing the structure which are created through steps S1 to S12 (drawing outputting function).

Figure 13:
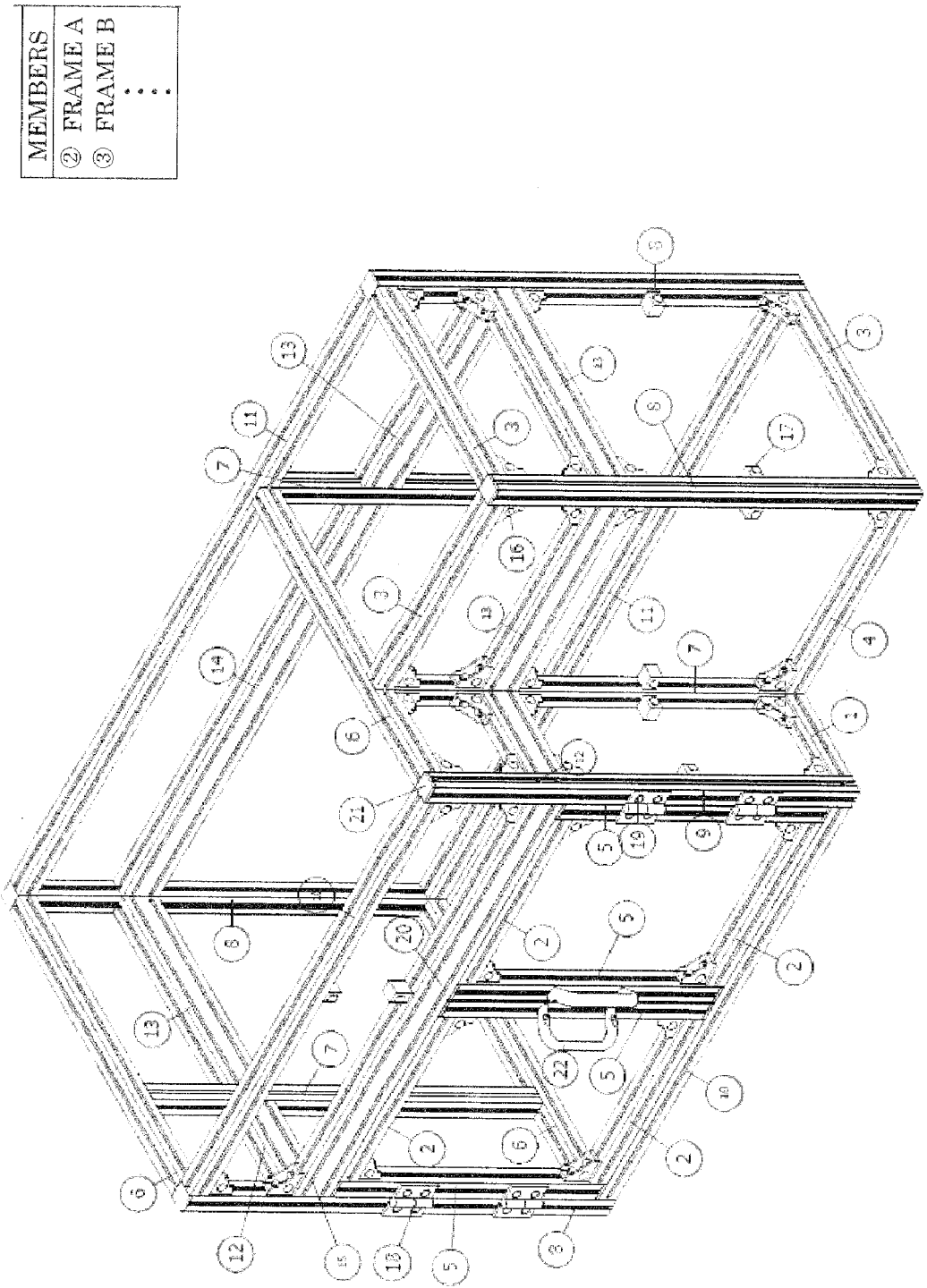
FIG. 13 is an example output drawing in which the structure with member numbers is depicted in a perspective view.

FIG. 13 is an example drawing which is output on the basis of the structure data and in which the structure with member numbers added thereto is depicted in a perspective view. In FIG. 13, the model numbers, names, and the like of the members corresponding to the member numbers are indicated within the frame at the top right. Such a perspective view facilitates understanding of the entire configuration of the structure. In addition, since the member numbers are added, the locations where the frame members of a plurality of types are used are clear at a glance.

Figure 14:
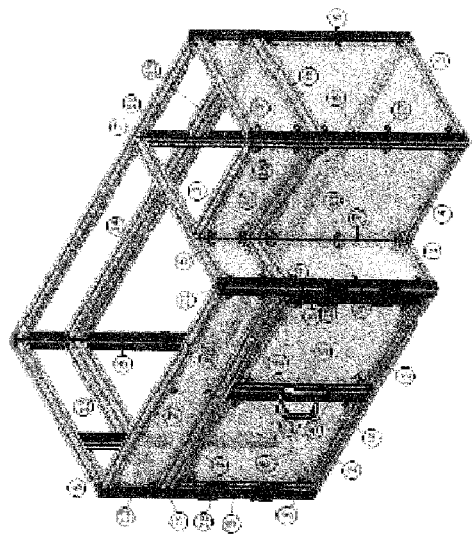
FIG. 14 is an example output drawing in which the structure is depicted in a front view, left and right side views, a top view, and a rear view.
Figure 14:
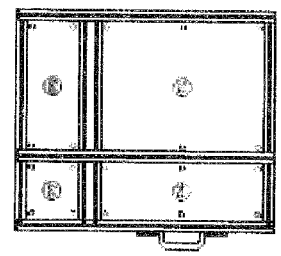
Figure 14:
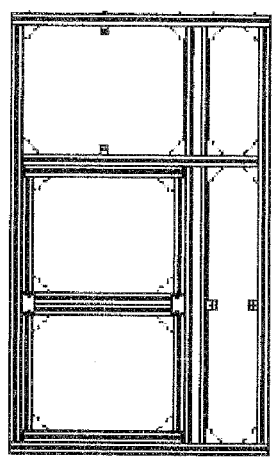
Figure 14:
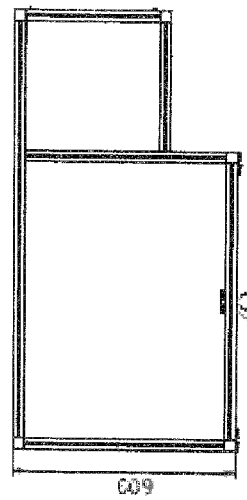
Figure 14:
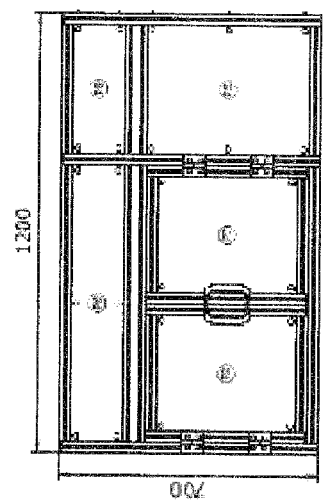
Figure 14:
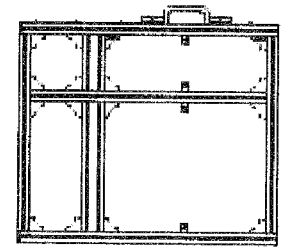

FIG. 14 is an example drawing which is output on the basis of the structure data and in which the structure is depicted in a front view, left and right side views, a top view, and a rear view. Since the program according to the invention is a three-dimensional CAD program, it can easily output drawings of the structure as viewed from various directions.

Figure 15:
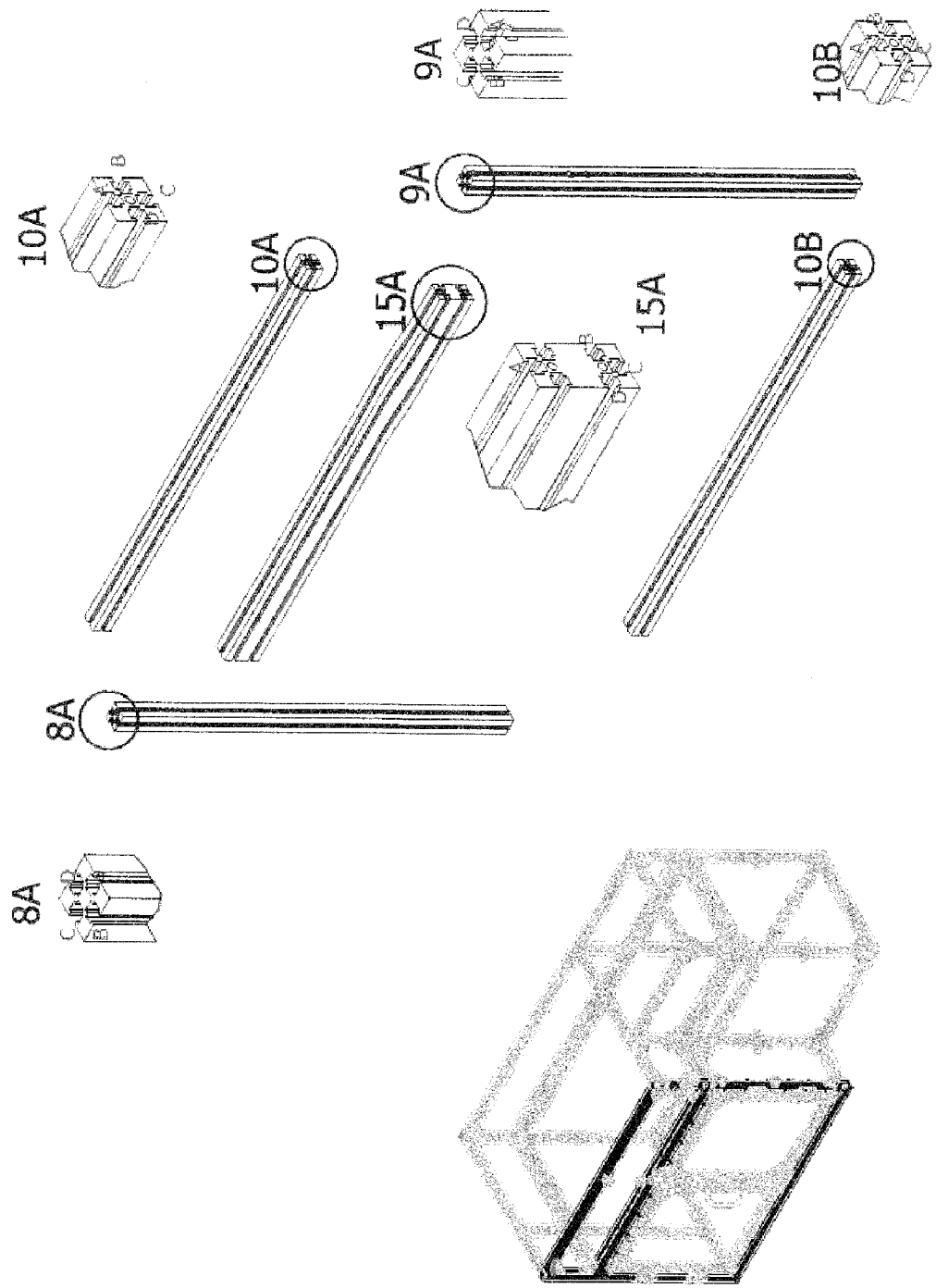
FIG. 15 is an example output drawing in which members related to a front portion are exploded.

FIG. 15 is an example output drawing in which the members related to the front portion are exploded. This is a so-called subassembly drawing. As described earlier, the partial structure defining function enables the user to collectively define, as a portion of the structure, members which constitute a front portion, a side portion, or the like portion of the structure. Therefore, a sub-assembly drawing can be obtained by outputting a drawing of the members that have been collectively defined as a portion of the structure. As described above, a sub-assembly drawing is automatically created by merely specifying the front portion, the side portion, or the like portion of the structure, and therefore, a burden imposed on the user of the CAD program can be reduced. In addition, by use of the sub-assembly drawings, partial structures can be made from various members such as frame members and fixing members, and the entire structure can be made from the partial structures. Accordingly, the work efficiency of the operators engaged in assembly is enhanced.

Figure 16:
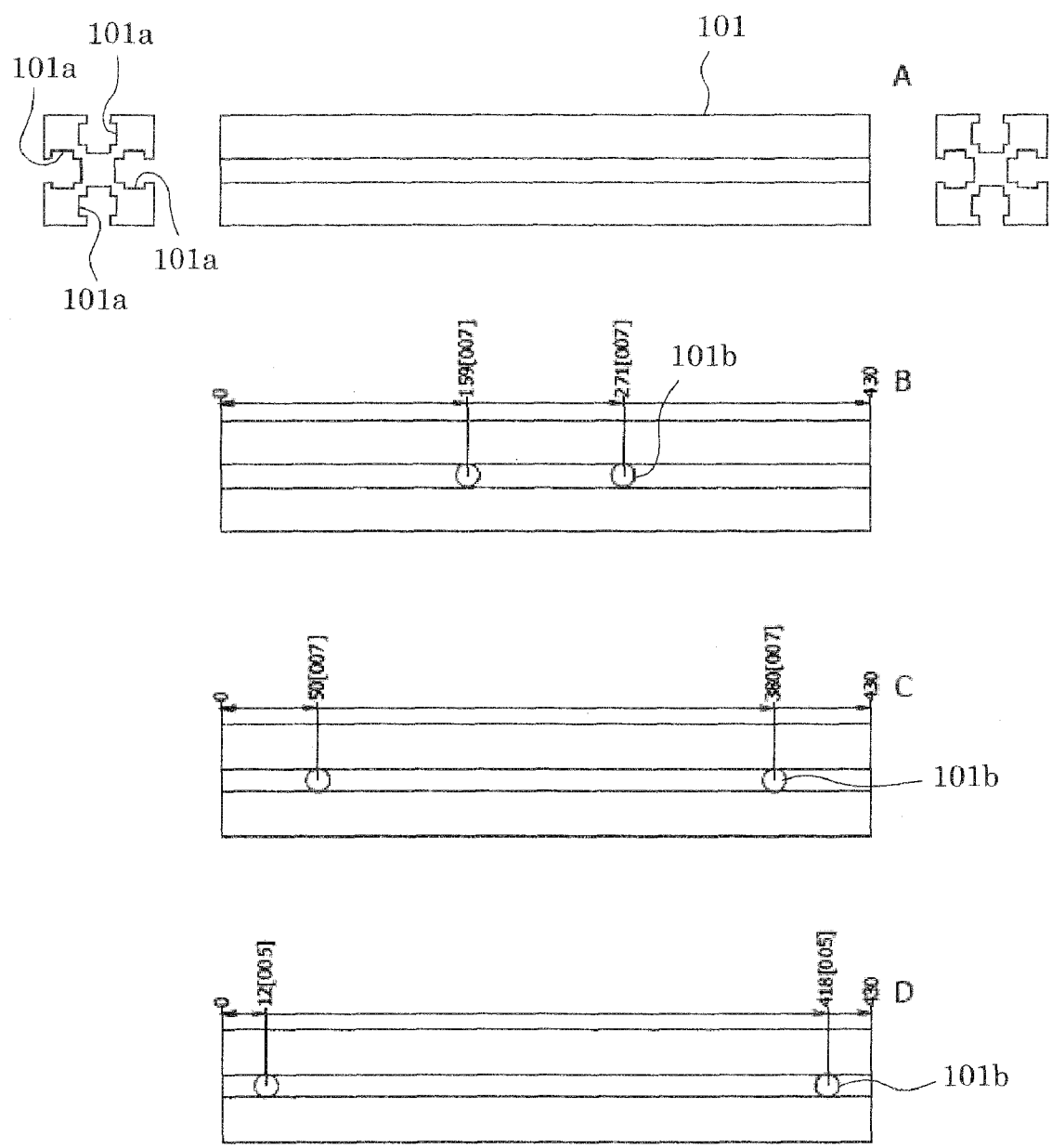
FIG. 16 is an example of a nut insertion instruction diagram.

FIG. 16 is a drawing which is output on the basis of the structure data and in which a frame member is depicted in six different views, and positions at which nuts (example fixing members) are placed are depicted. It seems that such a drawing related to a single member is unnecessary, in consideration that the structure is built by assembling the frame members, etc. However, such a drawing is useful for a case where fixing members need to be attached to one of paired frame members prior to assembly.

For example, a groove portion 101a which extends in the longitudinal direction is provided on each side of the frame member 101. Nuts, which are to be placed in each groove portion 101a, can be inserted into the groove portion 101a only from an end of the frame member 101. Accordingly, if the end of the frame member 101 is fixed in a state in which it abuts against another frame member, the nuts cannot be inserted in the groove portion 101a. Therefore, such a nut needs to be attached to one of paired frame members before the paired frame members are connected together.

According to the drawing of FIG. 16 (also referred to as a "nut insertion instruction drawing"), since placement positions 101b of the nuts are shown on the frame member 101, a mistake of forgetting to place nuts in the frame member before the paired frame members are connected together can be avoided.

In the CAD program as described above, a basic shape is created on the basis of parameters, and unnecessary lines are deleted from the basic shape or lines are added thereto, whereby a basic frame, which serves as the skeleton of the structure, is created. Next, frame members are automatically placed on the basis of the basic frame, whereby the structure data are automatically created.

As described above, according to the CAD program of the present invention, the user can obtain a basic shape by merely inputting parameters, and can obtain a basic frame, which serves as the skeleton of a structure, basically by merely deleting unnecessary lines from the basic shape. Further, by merely selecting frame members to be applied to the basic frame, the user can obtain a structure composed of the selected frame members. That is, the user can be freed from tiring work of selecting various members such as frame members, placing them at predetermined positions, and assembling them on a CAD screen while paying attention to a positional relationship with other members, and therefore the user can create structure data in a short time.

In addition, since structure data are created from operations such as inputting parameters, deleting lines, and selecting members, the user is not required to have advanced skill for operating a three-dimensional CAD system. Therefore, the CAD program of the invention has an advantageous effect of reducing time and cost required for improving the user's skill.

Further, in the case where a plate-like member, such as a door or a wall panel, is to be provided on the structure, by merely selecting frame members existing in a region where the user wishes to provide the plate-like member, the plate-like member can be automatically provided. Similarly, fixing members are also automatically placed at locations where the adjacent frame members must be fixed together. Accordingly, the user can design a structure even if the user has no experience of assembly operation.

Needless to say, advantages of the CAD program of the present invention are not limited to those for users as described above. That is, a perspective view which is output is easy to understand for those who assemble the structure. In addition, the perspective view, six-view drawing, etc. of the structure with part numbers, the sub-assembly drawings, and the nut insertion instruction drawing are useful for making assembly more efficient.

Second Embodiment

In the first embodiment, the CAD program executed by the single computer 1 is described. However, the CAD program may be executed by a server apparatus and client apparatuses which are computers connected with each other via communications means.

A structure design system according to the present embodiment assists a business model, in which an ordering party who requests design of a structure informs an order-receiving party of specifications and the like of the structure, and, in response to the request, the order-receiving party designs the structure by use of the CAD program according to the present invention and delivers drawings and the like to the ordering party.

Figure 17:
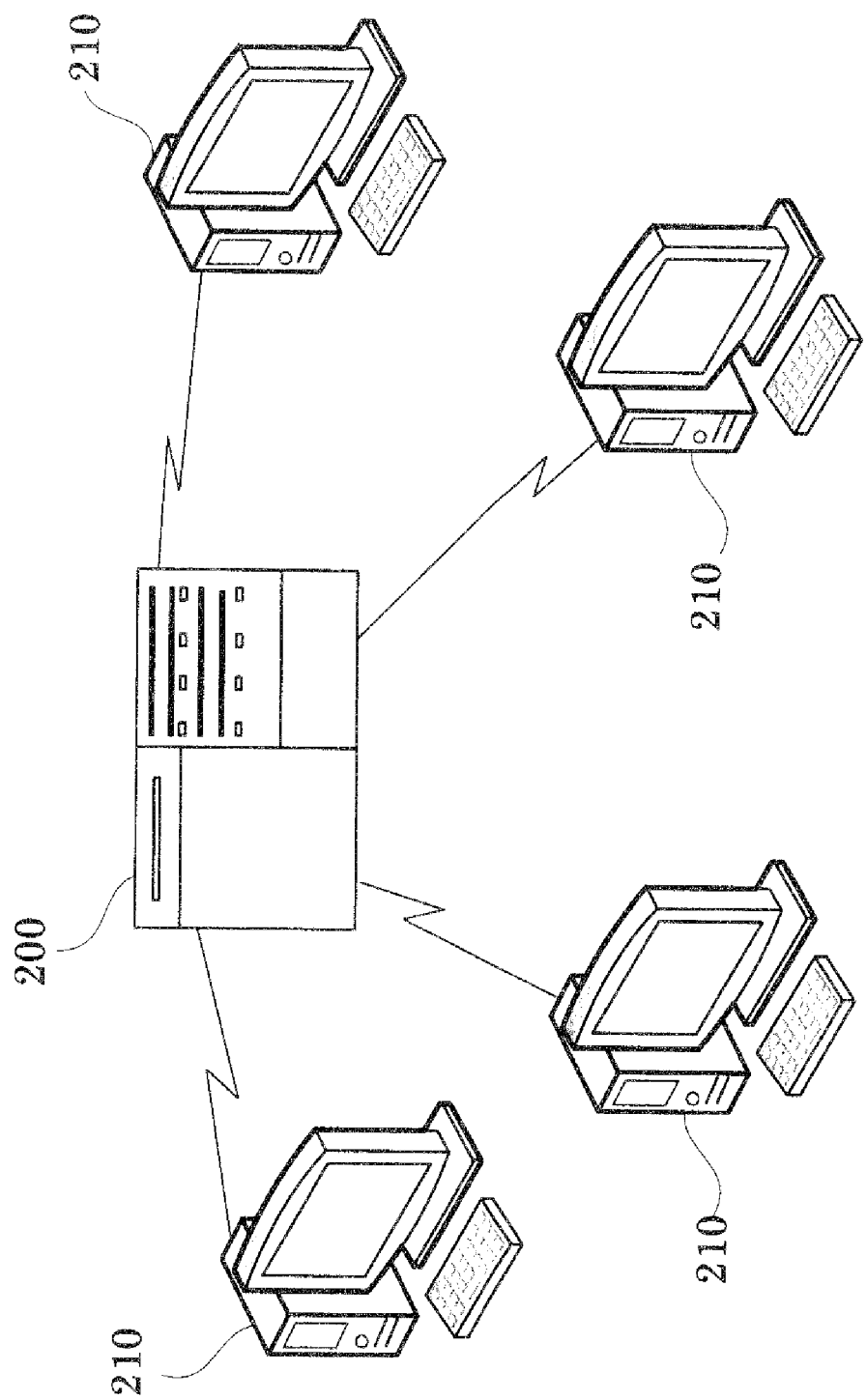
FIG. 17 is a schematic configuration view of a structure design system according to a second embodiment.

FIG. 17 is a schematic configuration view of the structure design system according to a second embodiment. As illustrated, a server apparatus 200 is connected to a plurality of client apparatuses 210 via the Internet (not illustrated), such that data can be transmitted and received therebetween.

Similar to the computer in the first embodiment, the server apparatus 200 includes hardware, such as a CPU, storage means, an input unit, an output unit, and communications means, and executes a CAD program. Meanwhile, the client apparatuses 210 are common computers, each of which includes a CPU, a storage unit (RAM, a hard disk, etc.), input means (a keyboard, a mouse, etc.), output means (a display, etc.), and communications means.

Each client apparatus 210 transmits to the server apparatus 200 specifications on the structure to be designed, in addition to the maximum length along the direction of each axis and the number of divisions of each side having the maximum length. The specifications on the structure refer to the information regarding the usage and function of the structure, and data of a rough sketch of the entire configuration. Notably, desires on the delivery and cost may be transmitted to the server apparatus 200.

The server apparatus 200 is configured to store in the database or the like the maximum length along the direction of each axis, the number of divisions of the side having the maximum length, and specifications on the structure, which are received from the client apparatus 210. Next, the operator executes the CAD program on the basis of the information stored in the database, and creates structure data. Subsequently, the structure data themselves are transmitted to the client apparatus 210. Alternatively, a drawing is formed on the basis of the structure data, and data of the drawing are transmitted to the client apparatus 210.

As described so far above, the structure design system according to the second embodiment enables design of a structure in a so-called client-server scheme. As described in the first embodiment, since the CAD program enables design of a structure in a short time, a service for designing a structure can be provided quickly even to a customer at a remote location.

What is claimed is:

1. A computer-readable storage medium storing CAD program instructions for designing a structure composed of a plurality of frame members, the CAD program causing a computer having input means and display means to realize:

an input function for acquiring, via the input means, maximum lengths of the structure as measured along X-axis, Y-axis, and Z-axis directions, and acquiring numbers of divisions of line segments which extend along the X-axis, Y-axis, and Z-axis directions, respectively, and have the maximum lengths, respectively;

a basic shape calculation function for calculating three dimensional data representing a basic shape which is the shape of a rectangular parallelepiped divided into a three-dimensional grid, and in which lengths of sides extending along the three directions are equal to the corresponding maximum lengths of the structure, and numbers of grid surfaces of the basic shape arranged in the three directions are equal to the corresponding numbers of divisions in the three directions;

a basic frame creation function for creating a basic frame of the structure from the basic shape by allowing an operator to select, via the input means, a line connecting grid points of the basic shape displayed on the display means in the form of a wire frame, to delete the line selected by the input means, and add a line between two grid points selected by the input means;

a structure data calculation function for calculating structure data, which are three-dimensional data representing the structure, by arranging frame members, which are represented by three-dimensional frame member data, along lines between the grid points of the basic frame; and a drawing outputting function for outputting a drawing of the structure from the structure data.

2. A computer-readable storage medium storing CAD program instructions according to claim 1, further causing the computer to realize a frame member editing function for allowing the operator to select, via the input means, a frame member of the structure displayed on the display means on the basis of the structure data, and replacing that frame member selected by the input means with a frame member of a different type.

3. A computer-readable storage medium storing CAD program instructions according to claim 1, further causing the computer to realize a plate-like member adding function for allowing the operator to select, via the input means, a plurality of frame members of the structure displayed on the display means on the basis of the structure data, calculating three-dimensional data representing a plate-like member which fits a region surrounded by the frame members selected by the input means, and calculating a position of the plate-like member in relation to the structure.

4. A computer-readable storage medium storing CAD program instructions according to claim 1, further causing the computer to realize a fixing member adding function for disposing three-dimensional data representing a fixing member for fixing frame members together, at a location where the frame members are connected together.

5. A computer-readable storage medium storing CAD program instructions according to claim 4, wherein the fixing member adding function adds to the structure data a placing position of the fixing member which must be attached to one of the frame members before the frame member are connected together; and the drawing outputting function outputs a drawing on which the placing position of the fixing member is depicted.

6. A computer-readable storage medium storing CAD program instructions according to claim 1, further causing the computer to realize a partial structure defining function for allowing the operator to select, via the input means, a plurality of frame members of the structure displayed on the display means on the basis of the structure data, and defining the frame members selected by the input means as a partial structure.

7. A computer-readable storage medium storing CAD program instructions according to claim 1, further causing the computer to realize a member number assignment function for assigning the same number to members of the same type among the frame members of the structure; and the drawing output function outputs a drawing of the structure along with the number.

8. A structure design system comprising:

a server apparatus which can execute a CAD program according to claim 1; and a client apparatus which can exchange data with the server apparatus via communication means, wherein the client apparatus sends the maximum lengths of the structure, the numbers of divisions, and specifications of the structure to the server apparatus; and the server apparatus executes the CAD program on the basis of the maximum lengths of the structure, the numbers of divisions, and the specifications of the structure, received from the client apparatus, to thereby calculate the structure data, and sends to the client apparatus a drawing of the structure on the basis of the structure data.

9. A method of designing a structure composed of a plurality of frame members by use of a computer including a processor, input means, and display means, the method comprising:

an input step in which the processor acquires, via the input means, maximum lengths of the structure as measured along X-axis, Y-axis, and Z-axis directions, and acquires numbers of divisions of line segments which extend along the X-axis, Y-axis, and Z-axis directions, respectively, and have the maximum lengths, respectively;

a basic shape calculation step in which the processor calculates three dimensional data representing a basic shape which is the shape of a rectangular parallelepiped divided into a three-dimensional grid structure, and in which lengths of sides extending along the three directions are equal to the corresponding maximum lengths of the structure, and numbers of grid surfaces of the basic shape arranged in the three directions are equal to the corresponding numbers of divisions in the three directions;

a basic frame creation step in which the processor creates a basic frame of the structure from the basic shape by allowing an operator to select, via the input means, a line connecting grid points of the basic shape displayed on the display means in the form of a wire frame, to delete the line selected by the input means, and add a line between two grid points selected by the input means;

a structure data calculation step in which the processor calculates structure data, which are three-dimensional data representing the structure, by arranging frame members, which are represented by three-dimensional frame member data, along lines between the grid points of the basic frame; and a drawing outputting step in which the processor outputs a drawing of the structure from the structure data.

* * * * *